United States Patent
Tirosh

(10) Patent No.: US 10,935,221 B1
(45) Date of Patent: Mar. 2, 2021

(54) FLEXIBLE STRIP LIGHT WITH SPRING-LOADED BASE

(71) Applicant: Orili Ventures LTD, Givat Brener (IL)

(72) Inventor: Udi Josef Tirosh, Givat Brener (IL)

(73) Assignee: Orili Ventures LTD, Givat Brener (IL)

( * ) Notice: Subject to any disclaimer, the term of this patent is extended or adjusted under 35 U.S.C. 154(b) by 0 days.

(21) Appl. No.: 16/835,519

(22) Filed: Mar. 31, 2020

Related U.S. Application Data

(60) Provisional application No. 62/829,185, filed on Apr. 4, 2019.

(51) Int. Cl.
| | |
|---|---|
| *F21V 21/08* | (2006.01) |
| *F21V 23/02* | (2006.01) |
| *F21V 31/00* | (2006.01) |
| *F21V 23/06* | (2006.01) |
| *H05K 1/02* | (2006.01) |
| *F21V 23/04* | (2006.01) |
| *H05K 1/18* | (2006.01) |
| *H02J 50/10* | (2016.01) |
| *F21Y 103/10* | (2016.01) |
| *F21Y 115/10* | (2016.01) |
| *F21V 23/00* | (2015.01) |
| *F21V 21/096* | (2006.01) |
| *H02J 7/02* | (2016.01) |

(52) U.S. Cl.
CPC ............ *F21V 21/08* (2013.01); *F21V 23/023* (2013.01); *F21V 23/0464* (2013.01); *F21V 23/06* (2013.01); *F21V 31/005* (2013.01); *H05K 1/028* (2013.01); *H05K 1/181* (2013.01); *F21V 21/0816* (2013.01); *F21V 21/096* (2013.01); *F21V 23/005* (2013.01); *F21Y 2103/10* (2016.08); *F21Y 2115/10* (2016.08); *H02J 7/02* (2013.01); *H02J 50/10* (2016.02); *H05K 2201/10037* (2013.01); *H05K 2201/10053* (2013.01); *H05K 2201/10106* (2013.01); *H05K 2201/10151* (2013.01); *H05K 2201/10189* (2013.01)

(58) Field of Classification Search
CPC ...... F21V 21/08; F21V 23/023; F21V 31/005; F21V 23/06; F21V 23/0464; H05K 1/028; H05K 1/181

See application file for complete search history.

(56) References Cited

U.S. PATENT DOCUMENTS

2012/0324945 A1   12/2012   Koeppel

*Primary Examiner* — Joseph L Williams
(74) *Attorney, Agent, or Firm* — Loginov & Associates, PLLC; William A. Loginov

(57) ABSTRACT

This invention provides a flexible strip light, having a linear array of LEDs mounted in conjunction with a spring-loaded base (a strip of spring steel) that includes a cambered cross section. The camber is adapted to provide beam strength when it is arranged in an extended orientation. The camber otherwise forces the base to roll when the base is bent in a direction opposite the curl of the camber. The diameter of the rolled cylinder can vary. In general the diameter of the base conforms to the cross-sectional dimensions of an underlying curved or polygonal supporting member. The bend can be induced by manually grasping two points on the base surface and causing it to bend against the camber, or simply allowing inertia to generate a bend as the base is struck or slapped against the supporting member. The base and lighting array can be covered with a durable polymer.

16 Claims, 13 Drawing Sheets

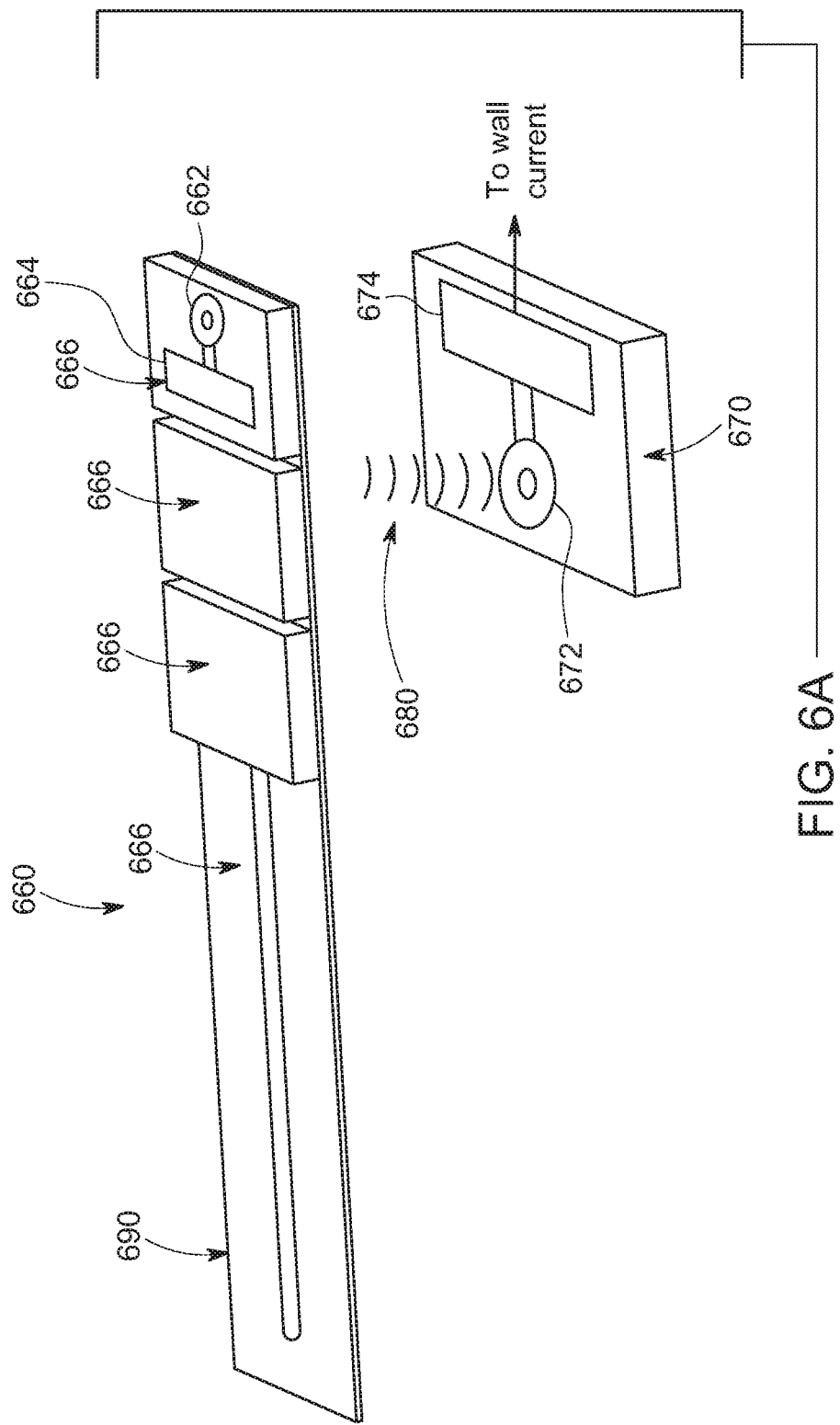

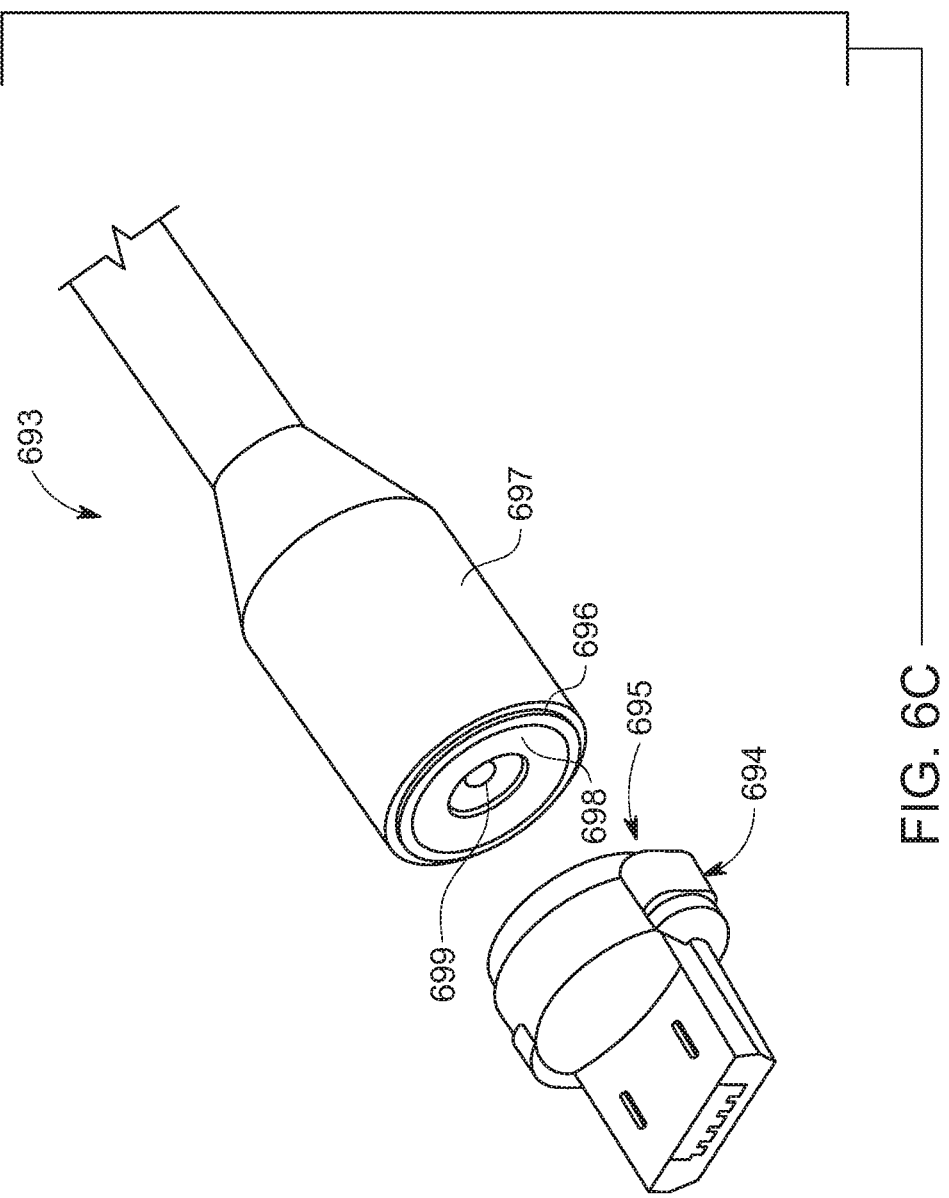

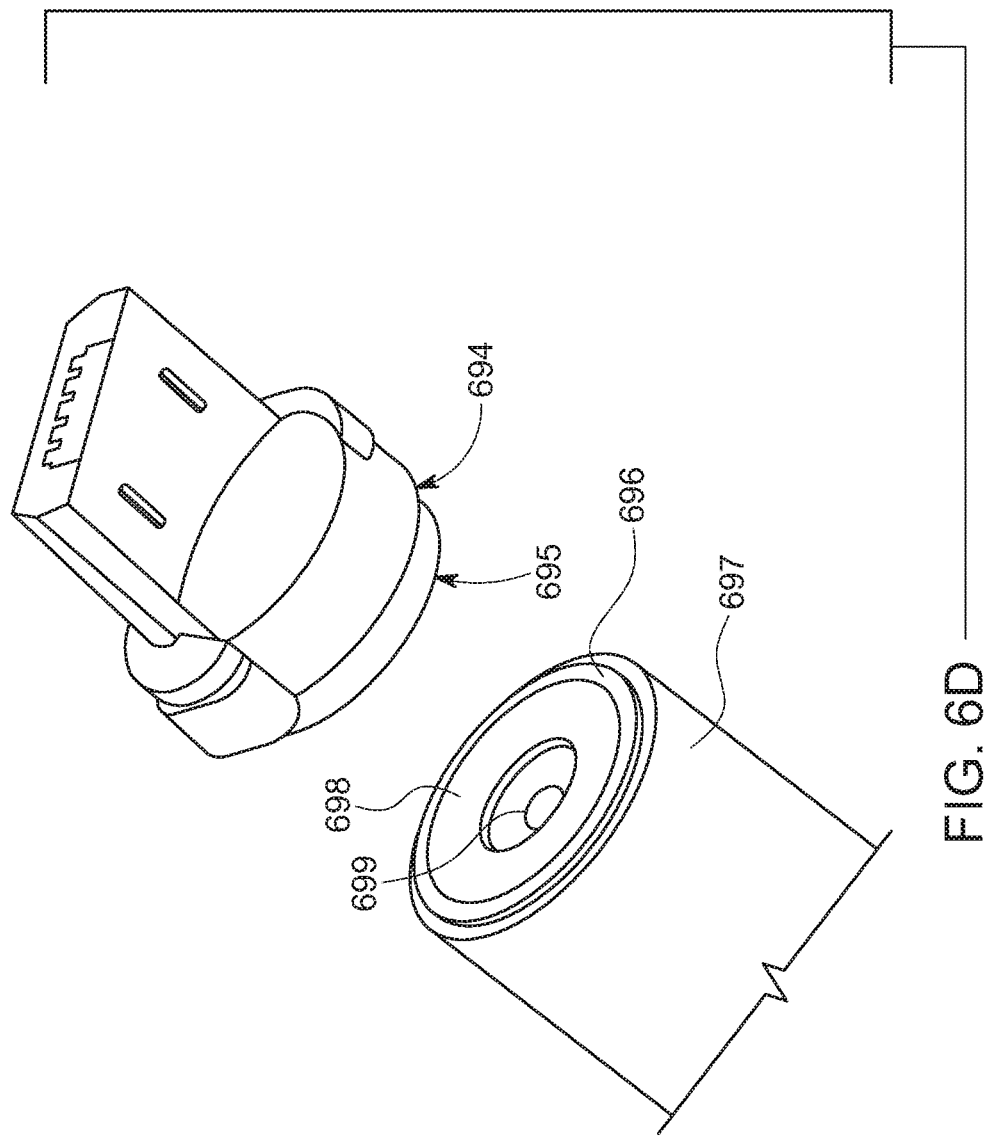

FLEXIBLE STRIP LIGHT WITH SPRING-LOADED BASE

RELATED APPLICATIONS

This application claims the benefit of U.S. Provisional Application Ser. No. 62/829,185, filed Apr. 4, 2019, entitled FLEXIBLE STRIP LIGHT WITH SPRING-LOADED BASE, the entire disclosure of which is herein incorporated by reference.

FIELD OF THE INVENTION

This invention relates to portable lighting devices and more particularly to lighting devices that provide a plurality of illumination sources in a line or strip.

BACKGROUND OF THE INVENTION

Lighting is a necessary aspect of many tasks. In photography and cinematography, the placement of lighting to directly illuminate a subject is often accomplished by dedicated, continuous-intensity lights and/or flashing strobes. However, many subjects require fill-in lighting to mitigate shadows and darkened areas and/or to further accentuate certain features. In some arrangements, the use of larger lights and flashes is also inconvenient or access to place such lighting may be limited. Thus, it is desirable to provide lighting that is compact, yet intense and readily placed in remote areas around a subject. Such lighting should also be stable and not prone to slippage or detachment from a mounting surface.

There are many other applications—for example repairing cars, camping, jogging, bicycling or working around the house, as well as in emergencies, such as power blackouts—where access to convenient, portable lighting that has the ability to adhere to various surfaces and supporting members is highly desirable. Many such lights are large, bulky and/or require wall-current power sources, or are limited to specific mounting locations—such as wearable headlamps or light helmets.

SUMMARY OF THE INVENTION

This invention overcomes disadvantages of the prior art by providing a flexible strip light, having a linear array of light sources (e.g. high-output LEDs) mounted in conjunction with a spring-loaded base (e.g. a strip of spring steel) that includes a cambered cross section. The cross section is adapted to provide beam strength to the base when it is arranged in an extended orientation. The camber otherwise forces the base to roll into a somewhat cylindrical orientation when the base is bent or curled in a direction opposite the curl of the camber. The diameter of the rolled cylinder formed by the base can vary. In general the diameter of the base conforms to the cross-sectional dimensions of an underlying curved or polygonal supporting member (e.g. a post, chair leg, railing, human wrist/ankle, etc.), to which the base is attached. The bend to cause the rolling action can be induced by manually grasping two points on the base surface and causing it to bend against the camber, or simply allowing inertia to generate a bend as the base is struck or slapped against the supporting member. The base and lighting array can be covered with a durable polymer that is flexible and generates friction against the supporting member to resist sliding and detachment. The base can support LED drive circuitry, single-use or rechargeable batteries and connections (e.g. mini/micro USB/USB-C) to attach an external (e.g. wall current/transformer-based/battery/power bank) power supply and/or gang the strip light with other similar lights in a daisy chain arrangement. Notably, the power and charging arrangement, via the power handling circuitry, allows for 100% light output while simultaneously charging the battery(ies). The strip light can also be charged wireless via (e.g.) an inductive charger that allows the cover to be fully sealed, free of holes, or slits as no socket is needed. Wireless communication can also be provided via (e.g.) Bluetooth® or WiFi to enable an external computing device (e.g. tablet, smartphone, PC or laptop) to control the functions of the droplight and/or monitor its performance (e.g. battery level light output, etc.). Such control and monitoring can be accomplished in the computing device using a downloadable (or otherwise loaded/stored or cloud-based) application.

In an illustrative embodiment a flexible strip light is provided, including a spring metal base that defines a camber in a linear orientation and that allows the base to define a rolled orientation when the camber is overcome. A flexible substrate, with a plurality of light sources along a length of the substrate, is mounted on the base. A power circuit on the base provides power to the light sources, and a cover seals the substrate and power circuit with respect to the base, and allows light to pass therethrough from the light sources. Illustratively, the power circuit includes one or more rechargeable batteries. The power circuit and the batteries are provided in pods on the base that are separated so as to allow bending therebetween. The power circuit is operatively connected to a charging socket in various implementations. The charging socket can be selectively covered by a movable flap that provides splash and dirt resistance to the socket when not in use. The socket can comprise a USB-based form factor. In various implementations, the power circuit includes an inductive charging circuit. An inductive charger is constructed and arranged to transmit power to the inductive charging circuit using electromagnetic energy. In such wireless charging arrangements the cover can be fully sealed and free of breaks or openings. In yet another implementation, the charging of the strip light batteries is accomplished via two magnetic terminals that are exposed via through the cover, but otherwise air-tight and water-tight. In such charging arrangements the cover can be fully sealed and free of breaks or openings thereon. Illustratively, the pod containing the power circuit includes a plurality of buttons for operating functions of the light sources. The buttons can be operated through the cover. Additionally, the buttons can be constructed and arranged to operate at least one of on/off, color/hue, color temperature (CCT), strobe and slave mode. In various implementations the cover can comprise a silicone-based elastomer. Illustratively, the cover includes a translucent, flexible window located over the light sources. The substrate can be a flexible PCB and the light sources are white or color LEDs. In various implementations, the substrate includes a photodetector for operating a slave mode that detects a bright light.

BRIEF DESCRIPTION OF THE DRAWINGS

The invention description below refers to the accompanying drawings, of which:

FIG. 6A is a diagram of a strip light according to an alternate embodiment showing a wireless charging arrangement, which allows an external socket, and any slits or ports in the cover, to be omitted in favor of a fully sealed unit;

FIGS. 6C and 6D are diagrams of a power and charging cord arrangement for the strip light according to another alternate embodiment in which the strip light socket receives a sealed base that engages a magnetically attached charging plug;

DETAILED DESCRIPTION

Figure 1:
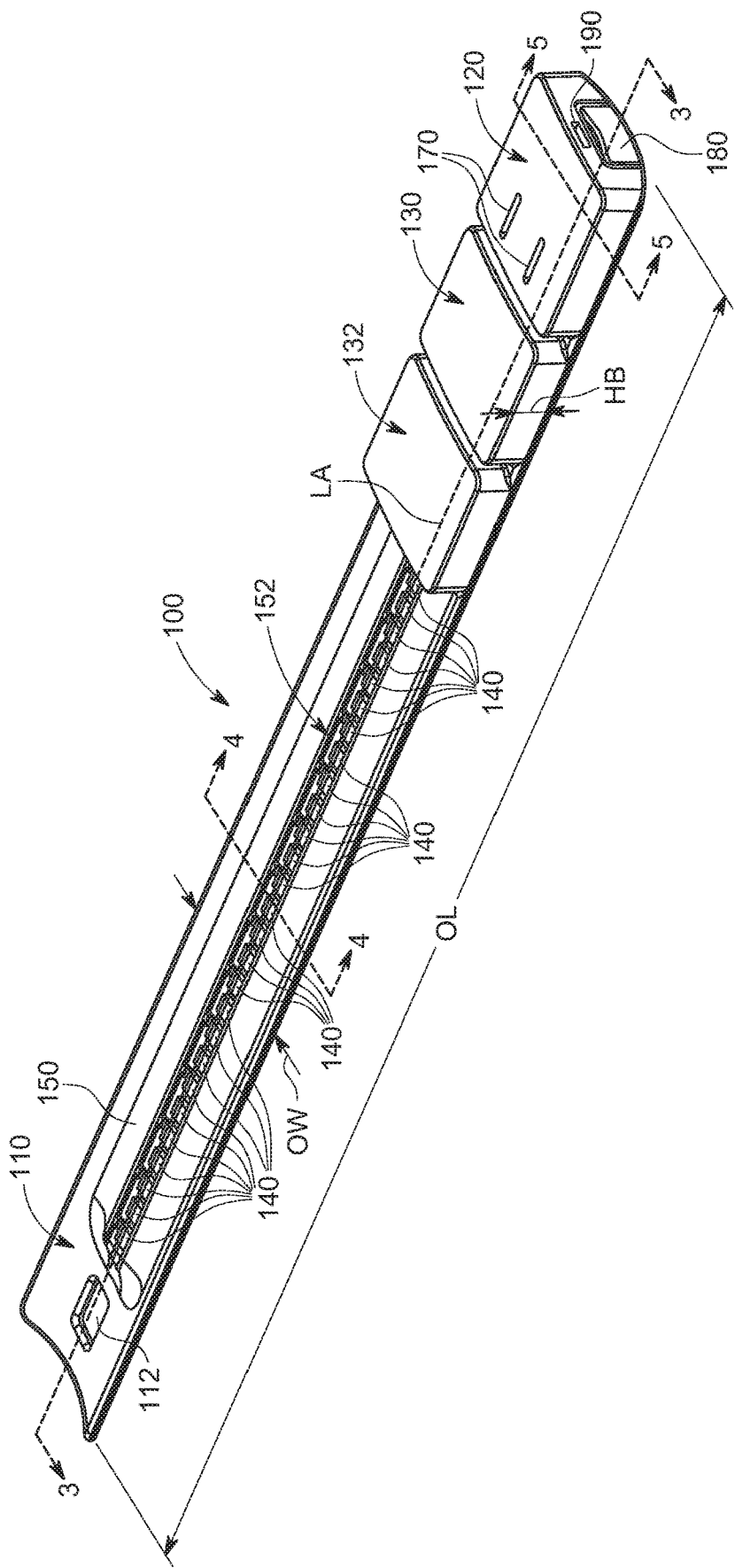
FIG. 1 is a top-oriented perspective view of a flexible strip light according to an exemplary embodiment.
Figure 2:
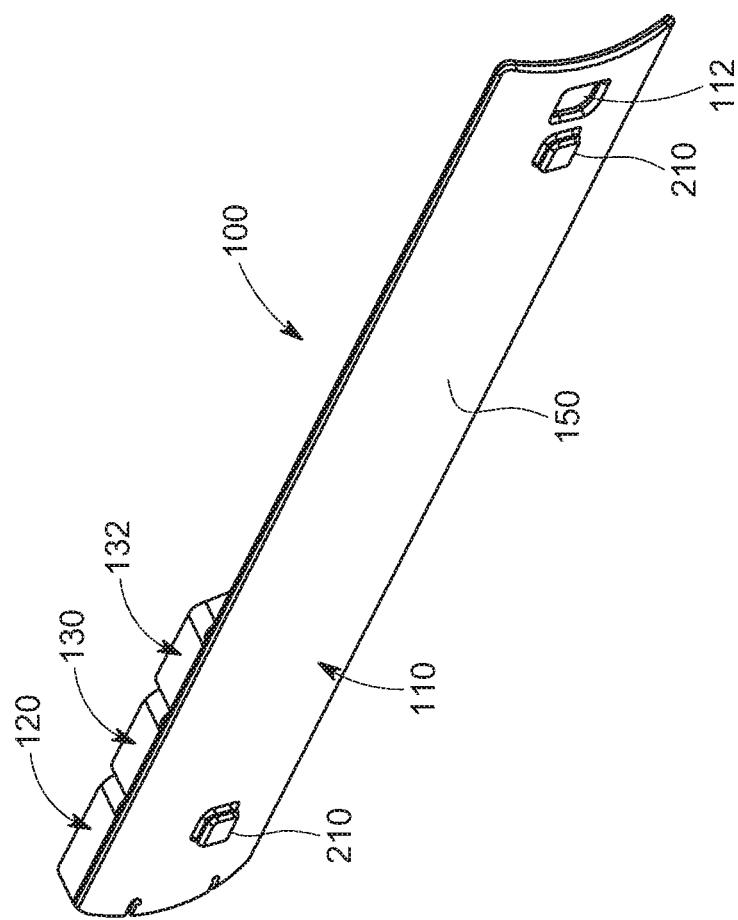
FIG. 2 is a bottom-oriented perspective view of the flexible strip light of FIG. 1.

FIGS. 1 and 2 show and overview of a flexible strip light 100 according to an exemplary implementation. The strip light 100 consists of a base 110, having a rear through-slot 112 that can be used to attach a keyring, lanyard or hanger. There are also at least two projections on the bottom that can each enclose a high-strength, magnet 210 to allow the strip to be secured to a ferro-metallic surface. In various embodiments, the magnets 210 can be flush with the bottom surface of the strip light 110. The base 110 of the strip light 100 also includes an electronics module or pod 120 at an opposing, front end. A pair of battery pods 130 and 132 are provided adjacent to the electronics pod. Any acceptable rechargeable (or single-use) battery can be used—for example, lithium-based, NiMH-based and/or NiCad-based. As described below, the battery pair generate 1.5 Watts to operate the LED array. As described below, larger wattage outputs (e.g. 4.5-5 Watts, or, in some embodiments, smaller outputs, are expressly contemplated. The electronics pod 120 includes on, off and output buttons, as well as a charging circuit. These are described further below. The base 110 also includes a single line of discrete light sources (e.g. high-output LEDs) 140, centered on the strip longitudinal axis LA. In alternate embodiments, described below, a plurality of LED rows (e.g. 2-3 rows) can be employed. In the depicted, exemplary arrangement, there are 28 individual light sources for the strip 100 having an overall length OL of approximately 223 millimeters. The LEDS comprise an array of warm-white and cool-white LEDs. 14 of each, intertwined. This configuration can run between warm light and cold light (2700CCT to 6500CCT). The overall width OW of the strip 100 is approximately 22 millimeters in this implementation. The maximum height HB in the region of the batteries 130 and 132 and circuit pod 120 is approximately 11 millimeters. In various embodiments, variations in dimensions, numbers of lights, and/or numbers of batteries are possible. As shown and described below, dividing the batteries and circuit pod into three units allows the strip to bend and roll by avoiding use of a long singular structure that would resist bending along its length.

Figure 5:
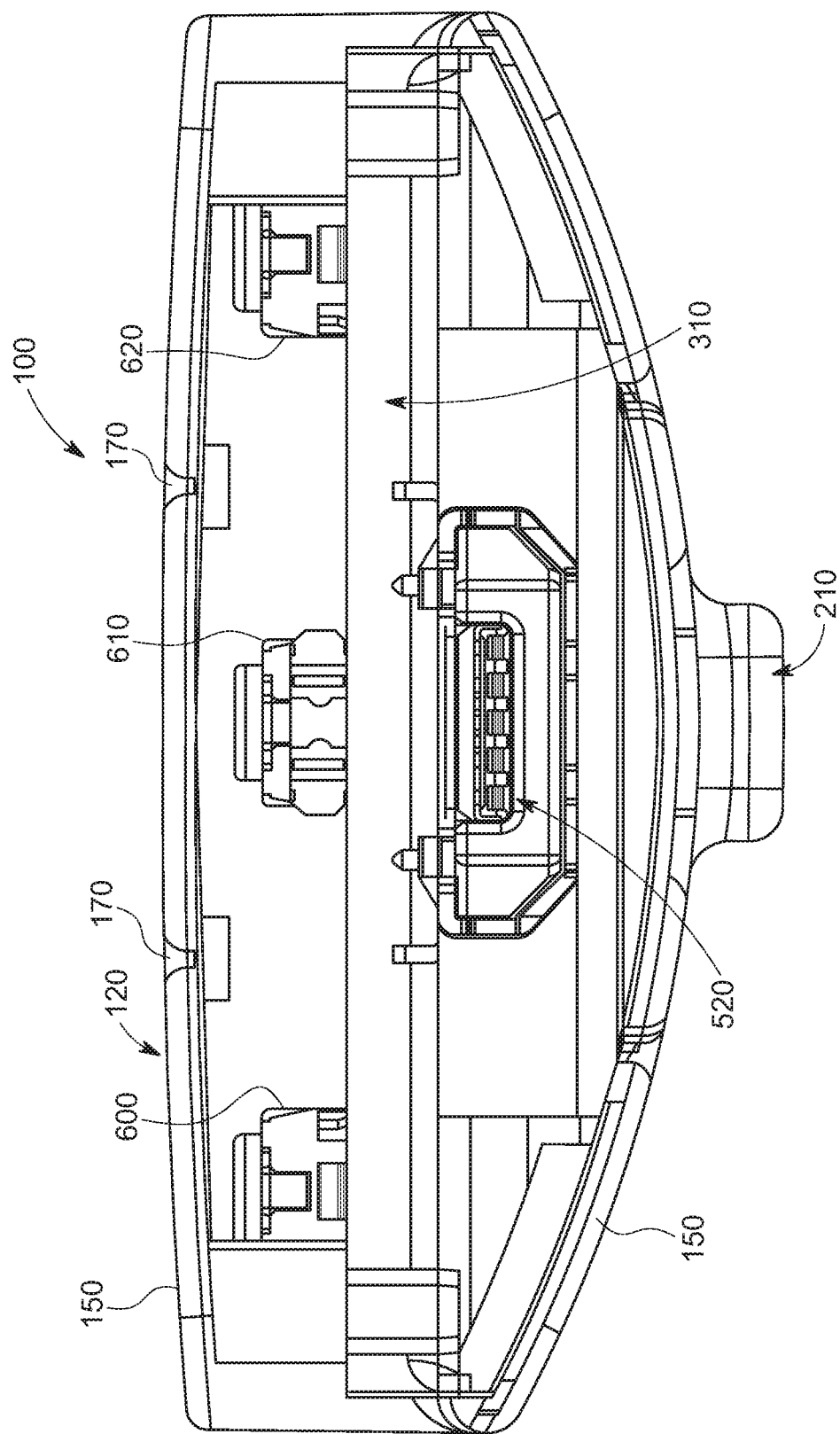
FIG. 5 is a transverse cross section in the region of the end-mounted power connector of the flexible strip light, taken along line 5-5 of FIG. 1.
Figure 6:
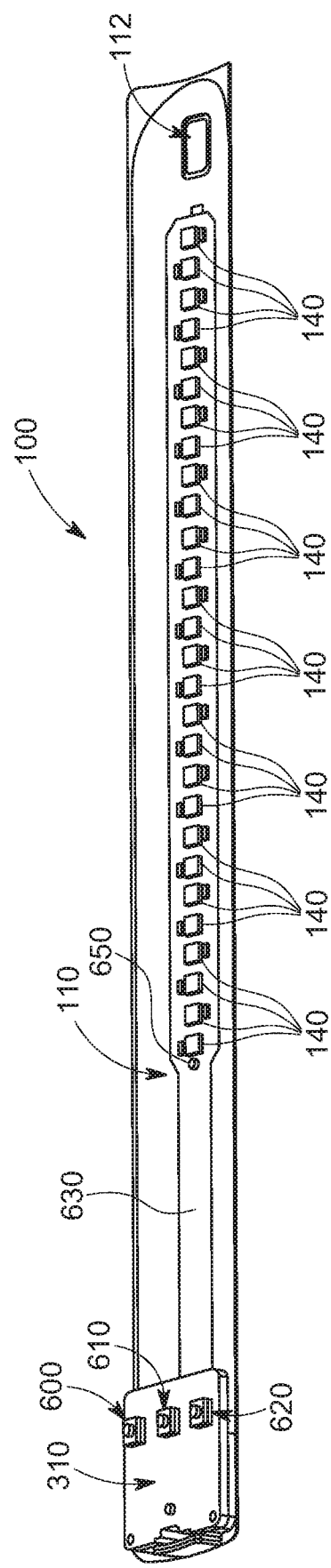
FIG. 6 is an exposed top-oriented perspective view of the strip light of FIG. 1, showing the outer elastomeric cover removed to reveal electronic circuit components and the linear array of LED light sources.

Referring also to FIGS. 3-6, the strip light 100 includes a unitary outer cover of elastomeric material (e.g. silicone) 150 along its top, sides and bottom that seals the unit against infiltration of dirt and moisture. The circuit pod 120 includes a circuit board 310. The circuit board includes various power handling and light control circuitry that should be clear to those of skill. It includes three momentary contact switches 600, 610 and 620 arranged in a transverse line (FIG. 6). It also includes a charging circuit for the batteries 330 and 340 (FIG. 3), which are connected via leads 350 or via a flexible printed circuit board (PCB) 630. The flexible PCB 630 also includes the LEDs 140 along its length. Any associated driver circuitry is provided on the PCB 630. The PCB 630 is applied to the base 110, which defines a metal band of (e.g. spring steel) using adhesives or by simply resting it upon the band and using the elastomeric cover 150 to hold the internal components in place. The metal band/base 110 can be any acceptable material that maintains the depicted upwardly directed camber when extended linearly as shown in FIGS. 1 and 2. The degree of camber is highly variable. In an embodiment the camber from center 420 to opposing tips 430 (FIG. 4) is approximately 3-10 millimeters. There are a wide range of commercially available bands, sometimes termed "slap bracelets", which can provide the base for the strip light 100 of the embodiments herein. One of skill should comprehend the structure of such bands, including camber, dimensions, material thickness, etc. A version of such a bracelet is shown and described in Published U.S. Patent Application No. US 2012/0324945, entitled DUAL FUNCTION BRACELET, filed Jun. 21, 2011, the teachings of which are incorporated herein by reference as useful background information.

The cover 150 includes a co-molded translucent (flexible) window 152 that overlies the LEDs 140. An underlying flexible lens 410 (FIG. 4) can also be provided. The cover also includes indents 170 that locate the three underlying buttons 600, 610, 620 and provide a stress-relief to assist in depressing the cover 150 in the region of the buttons. By way of non-limiting example, the buttons control on/off, brightness and color-temperature where the LEDs 140 are interleaved warm and cold white. In an alternate embodiment, the LEDs can define specific colors—for example, RGB. This embodiment can employ 14 RGB LEDs. Such an arrangement can be used to provide the entire visible spectrum of light—blue, red, magenta, green, and so on. The buttons can allow the user to cycle through the HUE circle and select a color that is appropriate. The buttons 600, 610, 620 can also control a strobing or flash pattern that can strobe the lights through various states—on, off, red, blue, etc. Also, the buttons can operate a slave function. The slave function allows the LEDs to operate in wait mode, and illuminate when a bright light is detected by photosensitive electronics on the circuit board 310 or PCB 630 (for example, photodiode 650 (FIG. 6). Thus, the LEDs strobe when a flash (e.g. from a photography flash unit) is detected.

Figure 3:
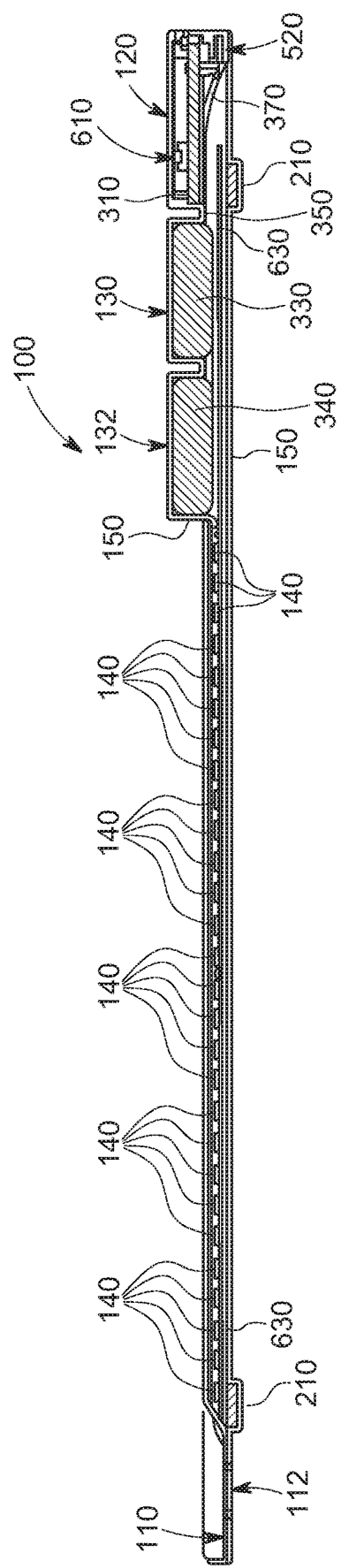
FIG. 3 is a side cross section of the flexible strip light, taken along line 3-3 of FIG. 1.
Figure 4:
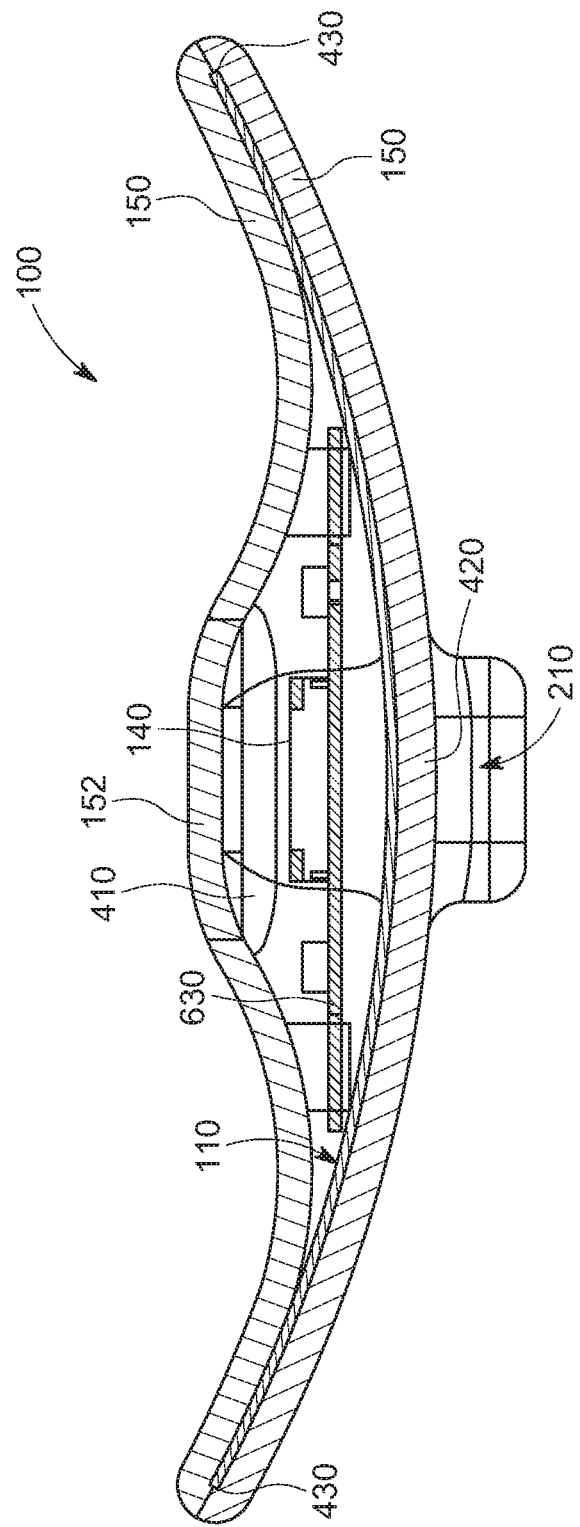
FIG. 4 is a transverse cross section of the flexible strip light taken along line 4-4 of FIG. 1.

The circuit board 310 supports a plug or socket 520, such as a mini or micro USB (or USB-C) 520 as shown in FIG. 5 (see also, FIG. 3 in which leads 370 are depicted). The socket 520 allows the strip light batteries 330 and 340 to be charged via a charging circuit on the circuit board 310. The charging circuit is also adapted to allow for full time powering of the strip light via the USB (or other) connection. In an optional implementation, the circuit board can allow the USB connection to deliver control and data to a processor on the circuit board 310 and/or PCB 630. Appropriate interface and processing components can be provided in a manner generally clear to those of skill. An application (e.g. downloadable over the Internet) on a remote control or computing device (e.g. laptop, computer, mobile phone, tablet, etc.) can be used to program functions, set light levels, monitor performance and/or control operation of the LEDs. An optional wireless connection (e.g. Bluetooth®, infra-red, WiFi, etc.) can be provided in other embodiments to pass control and data information in a manner clear to those of skill. The USB port can be covered by a movable plug or flap 180 that is molded as part of the overall cover 150. The flap 180 is hinged along a bottom side and open along the other three sides. It can include a molded plug member along its inner face to engage the walls of the (e.g.) USB socket 520. The flap renders the circuitry and socket substantially splash-proof when it is running on internal battery or being stored. Note that a slot 190 is provided above the USB flap 180 to secure the USB socket 520 within the pod 120. This slot 190 is exemplary and a variety of securing mechanisms can be used for this component and other components of the strip light.

It is contemplated that this element can be omitted in favor of a more robust seal or wireless (inductive) charging arrangement to make the strip light fully sealed/truly waterproof in certain embodiments. More particularly, and with reference to FIG. 6A, in a wireless-charging arrangement 660, coils 662, and/or other inductive charging circuit components, are operatively connected with the charging circuit/circuit board 664 (that can be functionally similar to board 310). The components are sealed under the silicone cover 666—which is free of any slits or openings. An inductive charging base/charger 670 receives the strip light 690 so that the light's inductive charging components 662 are in proximity to an induction coil 672 on the charger. The charger is driven by wall current or a large battery (e.g. a car battery) via a charger circuit/transformer 674. The charger thereby transfers electromagnetic energy 680 to the strip light in a manner clear to those of skill.

Figure 6B:
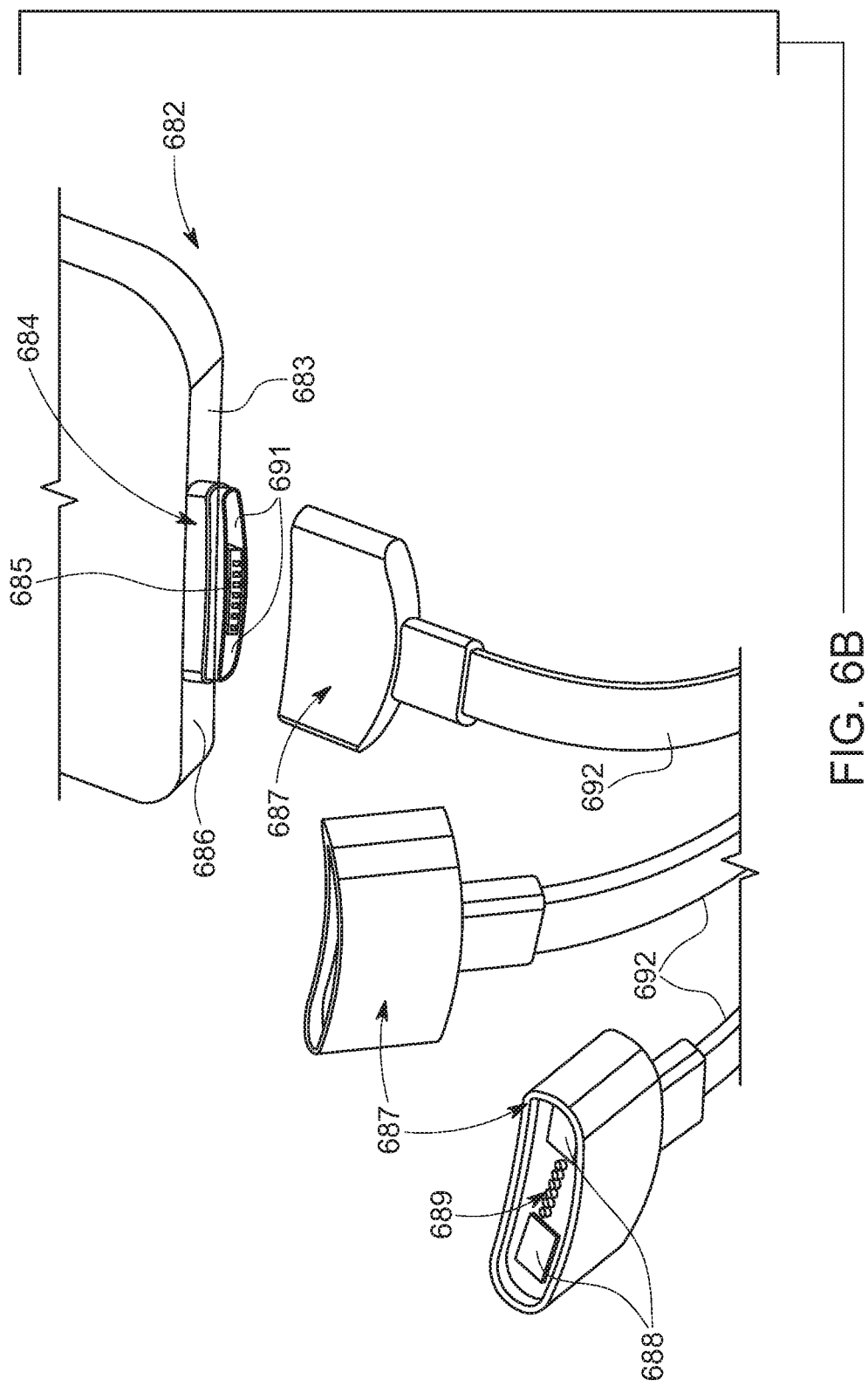
FIG. 6B is a diagram of a power and charging cord arrangement for the strip light according to an alternate embodiment in which the strip light socket receives a sealed base that engages a magnetically attached charging plug.

In yet another exemplary embodiment, shown in FIG. 6B, a charging and connectivity arrangement 682 is provided by a sealed plug 684 that engages the USB socket in the strip light end 683. The plug is adapted to resist infiltration of moisture into the interior of the strip light based upon a seal formed between the cover 686 and the inner face of the plug 684. The electrical contacts 685 of the plug 684 extend through a sealed layer and come into contact with the mating contacts 689 on a power cord end 687. These contacts 685 and 689 can define all the pins of a standard USB or can define another format of power and data leads. Notably, the end 687 is removably held in place against the plug 684 by a pair (or other arrangement) of magnets 688, located on each of opposing sides of the contacts 689. These magnets engage embedded (sealed) magnets 691 on opposing sides of the plug contacts 685. The opposing end of the cord 692 is connected to a wall current transformer or device (e.g. PC, laptop, smartphone, tablet, etc.) USB port. In this manner, the unit remains substantially sealed with minimal exposed electrical connections, none of which require a penetrating plug arrangement to be exposed.

Another embodiment of a sealed power and charging arrangement 693 is shown in FIGS. 6C and 6D. The 694 base in this arrangement is adapted to seal against the elastomeric cover (described above) of the strip light when engaged with the light's USB (or other format) socket. The exposed end 695 includes a magnetic ring that is adapted to removably engage a cord end with a sealed ring 696 surrounded by an elastomeric (silicone) cover 697 and seal 698, respectively. The center includes a contact 699 that engages a corresponding contact (not shown) on the on the base 694. It should be clear that a wide range of contacting, sealed arrangements can be provided in further embodiments.

In an embodiment, the batteries can provide over 1 hour on a single charge at 1.5 Watt output (color or white-light versions). In alternate embodiments—for example a so-called "pro" version—the LEDs can be adapted to provide 4.5-5 Watts of output. Such a version is particularly adapted to (e.g.) professional photographers and can define a width of approximately 4 centimeters. It can be shorter that the above described strip light embodiment 100. More generally, the size of the band, number of LEDs, placement (e.g. two or three side-by-side lines), spacing between LEDs, etc. can widely vary in alternate implementations. Depending upon the width of the base, and associated flexible PCB, a plurality of LEDs can be arrayed in square or other 2D pattern(s) on the PCB.

Figure 7:
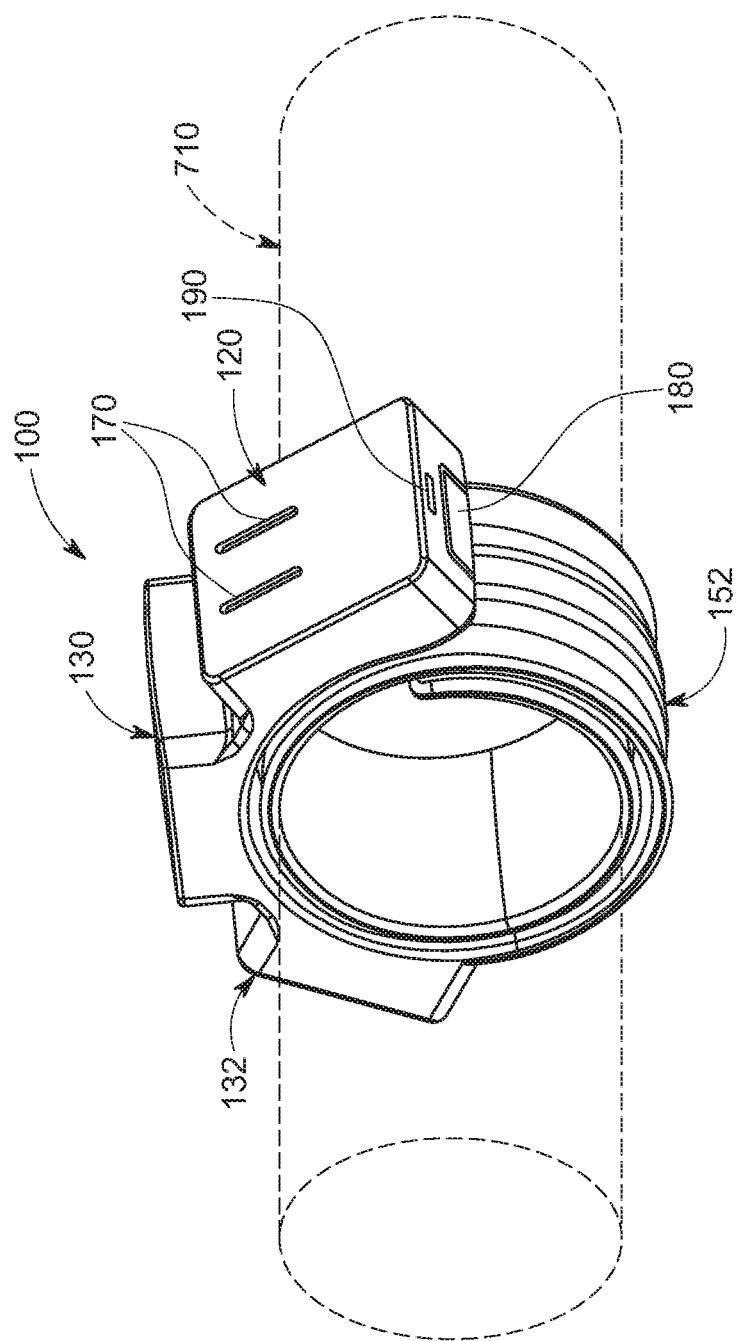
FIG. 7 is a perspective view of the flexible strip light, shown in a rolled orientation, engaging an exemplary support member (shown in phantom)
Figure 8:
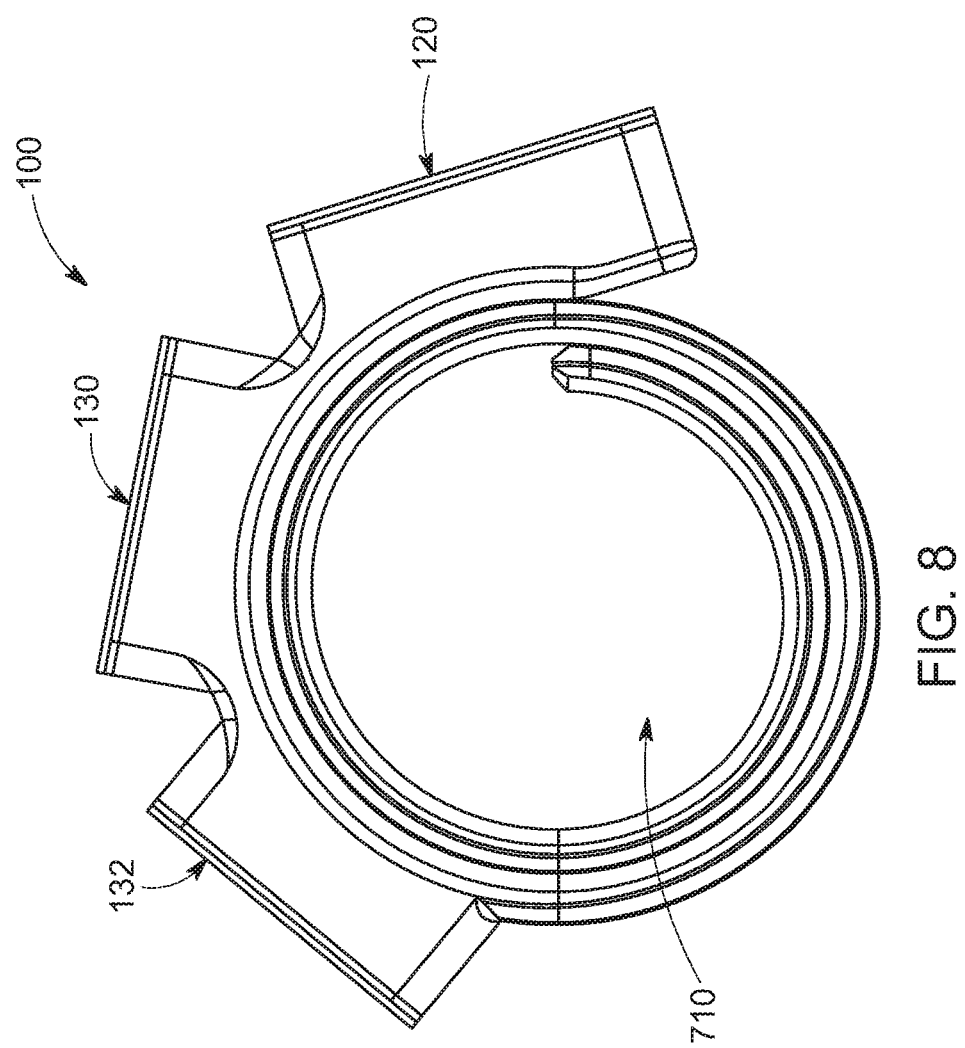
FIG. 8 is a side view of the flexible strip light of FIG. 1, shown in the rolled orientation.
Figure 9:
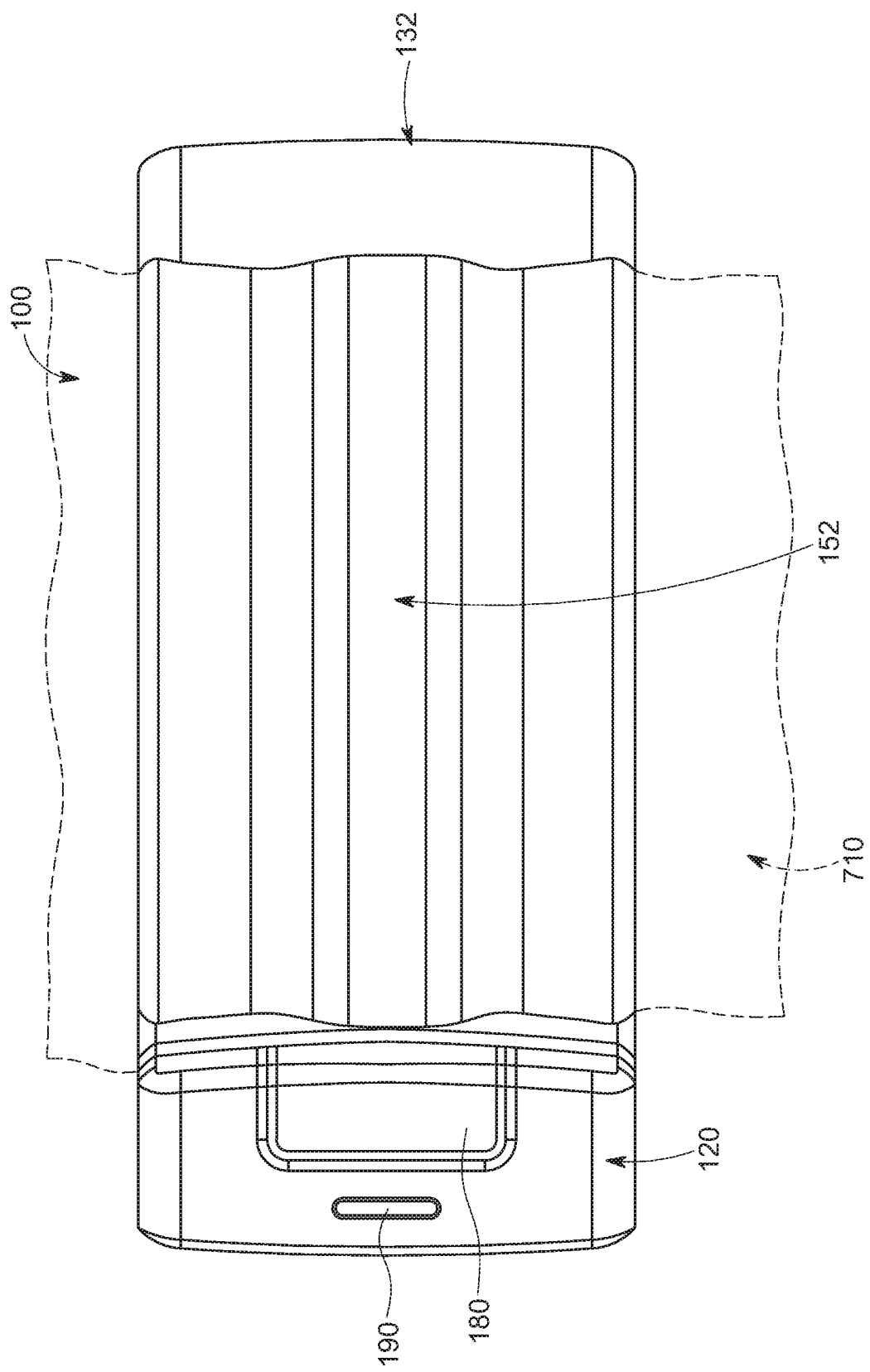
FIG. 9 is a top view of the flexible strip light shown in the rolled orientation, with at least some of the strip illuminator visible.

In operation, a user applies a bending pressure or slapping action, while holding the strip light 100 against a supporting member (e.g. a post, railing, chair arm, wrist, ankle, etc.). Such a configuration is shown in FIGS. 7-9. The band 100 is shown engaging a cylindrical post or other supporting member 710 (shown in phantom). The cross-section shape (e.g. round, elliptical, square and/or polygonal), dimensions and position of the supporting member 710 are widely variable. In the exemplary implementation the length of the strip light 100 is sufficient to provide a diameter of approximately 7 centimeters when rolled as shown. The cover 150 generates sufficient friction in response to the hoop stress generated by the band/base 110 to resist slippage, even when suspended on a vertical post. In alternate embodiments, hook and loop (e.g. Velcro®) and/or sticky (e.g. polyurethane) mountings can be used to provide substitute or additional holding friction.

As shown in FIGS. 7-9, in the rolled orientation, at least a portion of the light window 152 is exposed to project light toward a subject. The strip light should be mounted so that the light projects toward the desired subject. Desirably, a plurality of such strip lights can be placed at strategic locations to directly light or fill in other light in a space. Note that the base in the region of the battery pods 130, 132 and circuit board pod 120 all bend to define the roll.

It should be clear that the above-described flexible strip light provides the user with a versatile, easy to deploy and use, and effective system for providing task and fill lighting. It can be powered and controlled in a variety of ways and is durable, water and dirt-resistant and highly portable. Moreover, the flexible strip light of the above-described embodiments provides a utility lighting solution for a wide range of tasks. It can be adhered to a car (using either the rolling unction or magnets) while conducting repairs, or when stopped along a roadside. It can be used in camping or boating on a vessel or tent. The lights can flash and/or change color to attract attention in an emergency or to avoid being struck by vehicles. The light can be worn on an appendage when walking or jogging, or placed on a pet's collar or leg. It can be applied to a frame member of a bicycle. It can be used in a power blackout as a backup source. When plugged in, it can provide continuous room space lighting or a night light.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, as used herein, various directional and orientational terms (and grammatical variations thereof) such as "vertical", "horizontal", "up", "down", "bottom", "top", "side", "front", "rear", "left", "right", "forward", "rearward", and the like, are used only as relative conventions and not as absolute orientations with respect to a fixed coordinate system, such as the acting direction of gravity. Additionally, where the term "substantially" or "approximately" is employed with respect to a given measurement, value or characteristic, it refers to a quantity that is within a normal operating range to achieve desired results, but that includes some variability due to inherent inaccuracy and error within the allowed tolerances (e.g. 1-2%) of the system. Note also, as used herein the terms "process" and/or "processor" should be taken broadly to include a variety of electronic hardware and/or software based functions and components. Moreover, a depicted process or processor can be combined with other processes and/or processors or divided into various sub-processes or processors. Such sub-processes and/or sub-processors can be variously combined according to embodiments herein. Likewise, it is expressly contemplated that any function, process and/or processor herein can be implemented using electronic hardware, software consisting of a non-transitory computer-readable medium of program instructions, or a combination of hardware and software. Accordingly, this description is meant to be taken only by way of example, and not to otherwise limit the scope of this invention.

What is claimed is:

1. A flexible strip light comprising:
 a spring metal base that defines a camber in a linear orientation and that allows the base to define a rolled orientation when the camber is overcome;
 a flexible substrate with a plurality of light sources along a length of the substrate thereon, mounted on the base;
 a power circuit on the base that provides power to the light sources; and
 a cover that seals the substrate and power circuit with respect to the base and that allows light to pass therethrough from the light sources.

2. The flexible strip light as set forth in claim 1 wherein the power circuit includes one or more rechargeable batteries.

3. The flexible strip light as set forth in claim 2 wherein the power circuit and the one or more batteries are provided in pods on the base that are separated so as to allow bending therebetween.

4. The flexible strip light as set forth in claim 3 wherein the power circuit is operatively connected to a charging socket.

5. The flexible strip light as set forth in claim 4 wherein the charging socket is selectively covered by a movable flap that provides splash and dirt resistance to the socket when not in use.

6. The flexible strip light as set forth in claim 4 wherein the socket comprises a USB-based form factor.

7. The flexible strip light as set forth in claim 2 wherein the power circuit includes an inductive charging circuit, and further comprising an inductive charger constructed and arranged to transmit power to the inductive charging circuit using electromagnetic energy.

8. The flexible strip light as set forth in claim 7 wherein the cover is fully sealed and free of breaks or openings.

9. The flexile strip light as set forth in claim 2 wherein the power circuit is connected to charging contacts that are sealed against infiltration of dirt and moisture with respect to the cover, and further comprising a power cord having mating contacts that removably engages the charging contacts based upon magnetic attraction.

10. The flexible strip light as set forth in claim 2 wherein the pod containing the power circuit includes a plurality of buttons for operating functions of the light sources.

11. The flexible strip light as set forth in claim 10 wherein the buttons are operated through the cover.

12. The flexible strip light as set forth in claim 10 wherein the buttons are constructed and arranged to operate at least one of on/off, color/hue, color temperature (CCT), strobe and slave mode.

13. The flexible strip light as set forth in claim 1 wherein the cover comprises a silicone-based elastomer.

14. The flexible strip light as set forth in claim 13 wherein the cover includes a translucent, flexible window located over the light sources.

15. The flexible strip light as set forth in claim 14 wherein the substrate is a flexible PCB and the light sources are white or color LEDs.

16. The flexible strip light as set forth in claim 15 wherein the substrate includes a photodetector for operating a slave mode that detects a bright light.

\* \* \* \* \*